(12) United States Patent
Cok

(10) Patent No.: US 6,870,323 B1
(45) Date of Patent: Mar. 22, 2005

(54) COLOR DISPLAY WITH WHITE LIGHT EMITTING ELEMENTS

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/677,765

(22) Filed: Oct. 2, 2003

(51) Int. Cl.[7] .................................................. G09G 3/10
(52) U.S. Cl. ............................ 315/169.3; 315/169.1; 315/308; 345/83; 345/84; 345/204; 345/690
(58) Field of Search ........................... 315/169.3, 169.1, 315/169.2, 291, 308, 149; 345/76, 77, 83, 84, 204, 207, 690

(56) References Cited

U.S. PATENT DOCUMENTS

| | | | |
|---|---|---|---|
| 5,216,504 A | * | 6/1993 | Webb et al. ................. 348/190 |
| 6,191,764 B1 | * | 2/2001 | Kono et al. .................... 345/76 |
| 6,320,325 B1 | | 11/2001 | Cok et al. ................. 315/169.3 |
| 6,329,758 B1 | * | 12/2001 | Salam ...................... 315/169.2 |
| 6,747,618 B2 | * | 6/2004 | Arnold et al. ................. 345/77 |
| 2004/0113875 A1 | * | 6/2004 | Miller et al. ................... 345/82 |
| 2004/0150590 A1 | * | 8/2004 | Cok et al. ...................... 345/76 |

* cited by examiner

Primary Examiner—Haissa Philogene
(74) Attorney, Agent, or Firm—Thomas H. Close

(57) ABSTRACT

A color display includes an array of light emitting pixels, each pixel having a plurality of color light emitting elements for emitting different colors of light and at least one additional light emitting element for emitting white light, and wherein the power efficiency of the additional light emitting element is higher than the power efficiency of at least one of the color light emitting elements; means for generating a brightness control signal; and means responsive to the brightness control signal and a color display signal for generating a white display signal for driving the white light emitting element(s).

36 Claims, 4 Drawing Sheets

COLOR DISPLAY WITH WHITE LIGHT EMITTING ELEMENTS

FIELD OF THE INVENTION

The present invention relates to color displays and, more particularly, to color displays that include white light emitting elements.

BACKGROUND OF THE INVENTION

Light emissive displays provide a very bright and high contrast image when the ambient illumination from the surroundings is very low. When the ambient illumination is high, for example in sunlight, the contrast of the display may be much lower because the ambient illumination is reflected from the display and decreases the contrast of the display.

To some extent, ambient illumination on a display can be accommodated, for example, by making the display brighter. Techniques for sensing the ambient illumination and making a display brighter are known; see for example U.S. Pat. No. 6,320,325 by Cok et al., issued Nov. 20, 2001. However, simply increasing the power to a display is problematic, particularly for OLED displays whose emissive materials age more rapidly as the display gets brighter. However, such a design does not accommodate the need for improved efficiency.

While power efficiency and contrast are always desirable, they are particularly desirable in portable applications because an inefficient display limits the time the device can be used before the power source is recharged. In fact, for certain applications the rate of power consumption may be more important than any other display characteristic with the exception of visibility.

There is a need, therefore, for an improved display having improved power efficiency and contrast.

SUMMARY OF THE INVENTION

The need is met according to the present invention by providing a color display that includes an array of light emitting pixels, each pixel having a plurality of color light emitting elements for emitting different colors of light and at least one additional light emitting element for emitting white light, and wherein the power efficiency of the additional light emitting element is higher than the power efficiency of at least one of the color light emitting elements; means for generating a brightness control signal; and means responsive to the brightness control signal and a color display signal for generating a white display signal for driving the white light emitting element(s).

Advantages

The advantages of this invention are a color display device with improved power efficiency and contrast.

DETAILED DESCRIPTION OF THE INVENTION

Figure 1:
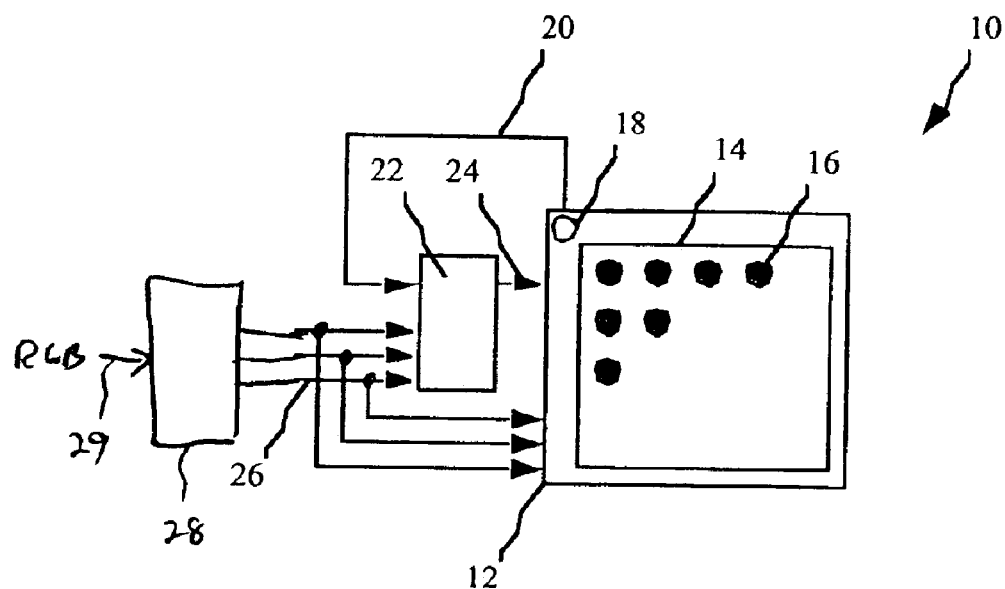
FIG. 1 is a schematic diagram according to one embodiment of the present invention.

Referring to FIG. 1, an emissive display device 10 according to the present invention includes a display 12 having an array 14 of pixels 16 composed of color light emitting elements defining a gamut and an additional white light emitting element. As defined herein, white light means any color of light that falls within a gamut defined by the colors of light emitted by the color light emitting elements. The display 12 includes a sensor 18 for sensing ambient illumination incident on the display 12. The sensor 18 supplies a brightness control signal 20 to a circuit 22 which is responsive to the brightness control signal and a color display signal 26 to generate a white display signal 24 for driving the white light emitting elements in the pixels 16. The color display signal 26 is employed in a conventional manner for driving the color light emitting elements in the pixels 16. In a simplified embodiment, the means for generating a brightness control signal (sensor 18) may be replaced by a manually controlled adjustment such as a knob or slider that the user adjusts to change the brightness of the display.

Figure 2:
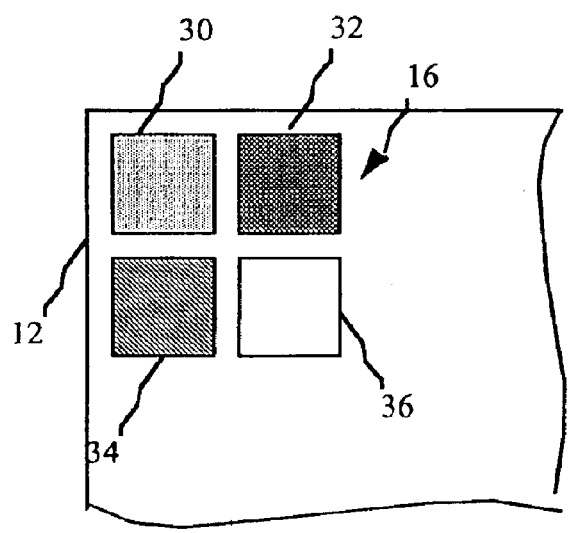
FIG. 2 is a schematic diagram showing an arrangement of light emitting elements in a pixel of a display according to an embodiment of the present invention.

Referring to FIG. 2, each pixel 16 of the array 14 includes a plurality of color light emitting elements, such as red 30, green 32, and blue 34 elements that define a gamut and an additional white light emitting element 36 having a higher efficiency than the color light-emitting elements.

In operation, the display device 10 responds to the color display signals 26 to drive the color light emitting elements 30, 32, and 34 to display information, for example, images on the display 12. The sensor 18 detects the ambient light illumination on the display 12 and creates a brightness control signal 20 connected to a white display signal generating circuit 22. The white display signal generating circuit 22 creates a white display signal 24 for driving the in-gamut additional white light emitting elements 36. Thus, as the ambient illumination becomes brighter, the brightness of the display is increased while reducing the saturation of the display. The in-gamut additional white light emitting element 36 is more efficient than at least one of the color light emitting elements 30-34. Thus, as the ambient illumination increases, the brightness and overall relative efficiency of the display will increase as the light contributed by the additional light emitting element 36 increases. White light emitters with an efficiency higher than color light emitters are known in the art.

The white display signal generating circuit 22 may be a very simple circuit that converts the brightness control signal 20 to a form suitable for combining with the color display signals. For example, the brightness control signal 20 may be a voltage or current value that is sensed and converted to a digital or analog signal compatible with the display 12. A display controller 28 receives a conventional color image signal 29, such as an R,G,B color signal and provides timing and control signals that are provided to the display 12.

The white display signal W may be formed, for example as follows:

$$W=(R+G+B)/C*F(a), \quad (1)$$

where C is an empirically determined constant and F(a) is a function of the brightness control signal and may simply be a constant times the brightness control signal, or may take a variety of forms as described below. These functions can be implemented by look up tables or operational amplifiers as is known in the art.

This design has the advantage of a very simple implementation. The ambient illumination sensor 18 may be external to the display 12 or it can be integrated on a common substrate with pixels 16. The white display signal generating circuit 22 can also be integrated onto the same substrate. Alternatively, the white display signal generating circuit 22 can be integrated in a separate circuit with display controller 28. The integration of pixel elements, sensor, and circuitry onto a common substrate are all well known capabilities found in the display industry.

Figure 4A:
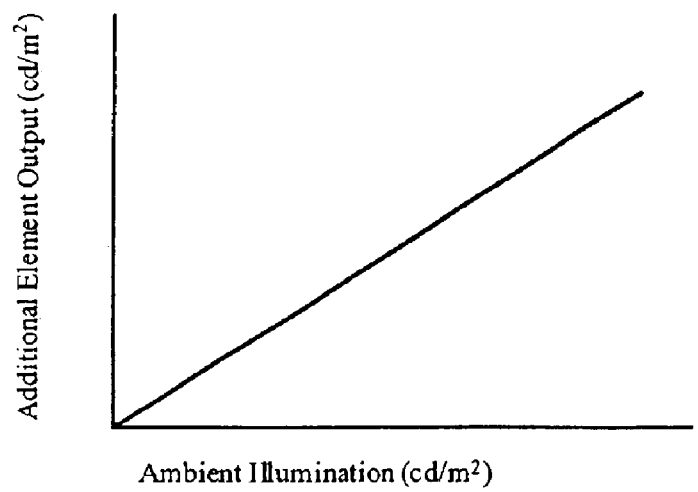
FIGS. 4a-c are graphs showing relationships between the ambient illumination and display output according to various embodiments of the present invention.
Figure 4B:
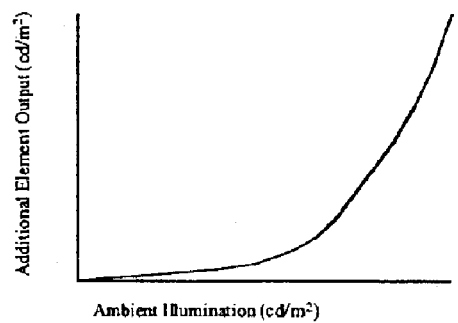
Figure 4C:
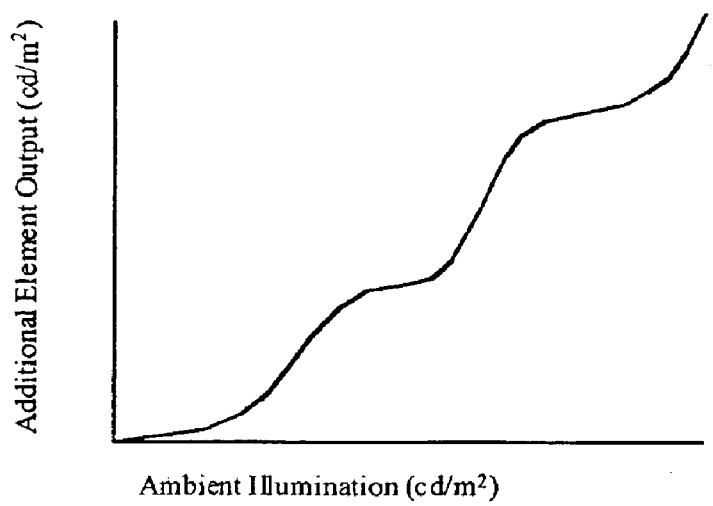

There are a variety of relationships that can be devised between the feedback signal 20 and the signal 24 for driving the additional light emitting element 36. A simple monotonic relationship is most suitable but it need not be linear. For example, the signal 24 for driving the additional light emitting element 36 can be very low for all ambient feedback signals corresponding to ambient conditions under 150 cd/m2. This provides optimum color saturation in darker conditions. As the ambient illumination increases beyond this point, display brightness becomes a much more significant factor and the display contribution from the additional light-emitting signal can grow much faster to provide a brighter display. Referring to FIG. 4a, a linear relationship between ambient illumination and additional light emitting element brightness is shown. FIG. 4b shows a non-linear function as described above. This concept can be extended to multiple phases as is shown in FIG. 4c where additional contributions from the additional light emitting signal are increased rapidly after staying relatively constant as the ambient illumination incident on the display increases.

Figure 3:
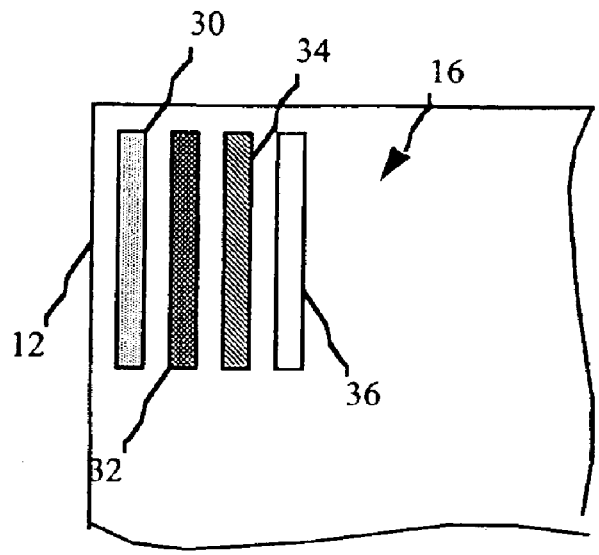
FIG. 3 is a schematic diagram showing an alternative arrangement of light emitting elements in a pixel of a display according to an embodiment of the present invention.
Figure 5:
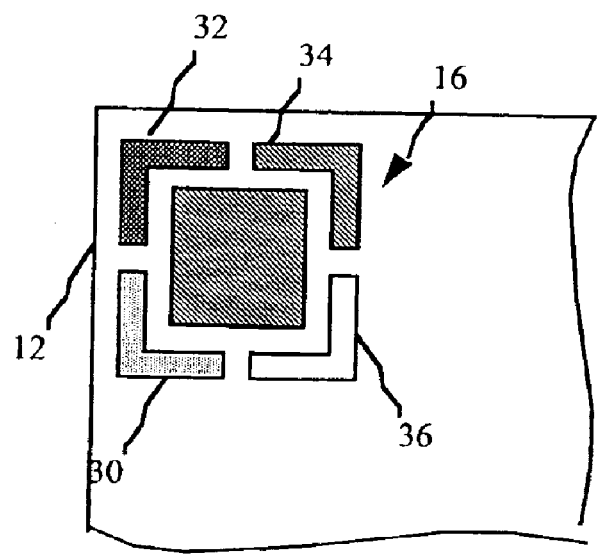
FIG. 5 is a schematic diagram showing a further alternative arrangement of light emitting elements in a pixel of a display according to an embodiment of the present invention.
Figure 6:
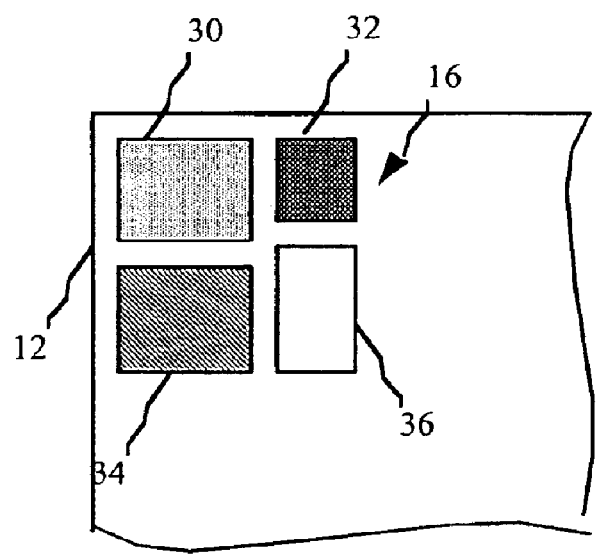
FIG. 6 is a schematic diagram showing a still further alternative arrangement of light emitting elements in a pixel of a display according to an embodiment of the present invention.

A variety of pixel layouts and shapes may be considered and are considered within the scope of the present invention. For example, FIG. 2 illustrates a two-by-two or "quad" arrangement. Alternatively, the light emitting elements 30-36 may be arranged in stripes, as is known in the art and illustrated in FIG. 3. Other light element shapes may also be employed other than rectangular as is shown in FIG. 5. It is also possible for the different light emitting element to have different sizes as is shown in FIG. 6. It is well known that the efficiencies and aging characteristics of the various different colored light emitters are different. This can result in changes in display efficiency and color over time as the display is used. By using different sizes of light emitting elements 30-36, these problems can be overcome to some extent.

It is also important that the white point of the display remain constant as the saturation decreases. This is most readily accomplished by ensuring that the white light emitting element 36 emits light at the same white point as the white point of the display.

According to the present invention, the additional white light emitting elements may provide a greater luminance contribution than either the red or blue elements. It is well known that the green element also provides a greater luminance contribution than either the red or blue elements. Hence, by positioning the additional element and the green element in a spatially uniform way within a pixel and across the display, image quality is enhanced.

The present invention can be employed in most OLED and back lit LCD device configurations that include four OLEDs per pixel. These include very simple structures comprising a separate anode and cathode per OLED to more sophisticated devices, such as passive matrix displays having orthogonal arrays of anodes and cathodes to form pixels, and active matrix displays where each pixel is controlled independently, for example, with a thin film transistor (TFT). The present invention can be employed in either a top or bottom emitting OLED device of the types known in the prior art.

The different colored light emitting elements may be provided by a uniform white light emitting layer of OLED material to provide an array of white light emitting elements and an array of color filters overlaying the white light emitting elements to provide the colored light emitting elements of the present invention. In this implementation, the efficiency of the additional element will be higher than that of the gamut defining elements if no filter, or a broad spectrum filter is provided over the additional element. Although a single OLED material is used, variations in element use can cause variations in element aging.

Alternatively several different OLED materials that are doped to provide multiple colors may be used to construct the differently colored light emitting elements. For example, the red 30, green 32, blue 34 and white 36 OLEDs may be composed of different OLED materials that are doped to produce different colored OLEDs. In this alternative implementation, OLEDs formed from materials that are doped to produce different colors may have significantly different luminance efficiencies and therefore it may be desirable to select a white OLED with chromaticity coordinates that are biased towards the chromaticity coordinate of the OLED with the lowest power efficiency. By selecting the chromaticity coordinate of the white OLED in this way, the overall power usage may be decreased at the cost of shifting the white point of the display as saturation decreases and the contribution of the white OLED increases.

In the embodiments that have been discussed above, it is important to note that because the additional element is significantly more efficient than at least one of the gamut elements, the current density or power required to drive the additional element is significantly lower than for the at least one gamut element(s). It is also important to note that the luminance stability over time of the materials used to create the light emitting elements is typically related to the current density used to drive the elements through a very non-linear function in which the luminance stability over time of the material is much poorer when driven to higher current densities.

To optimize a display device for various applications, differently sized elements may be used. Studies conducted by the present Inventors have shown that saturated colors are rarely found in either images or graphic applications. Hence the efficiency of a display can be improved by using the additional element in the place of the gamut defining elements. Moreover, the use of the additional element can be so high in typical applications that in order to reduce the current density in the additional element, it is useful to increase the size of the additional element. Typical OLED materials presently in use have a relatively higher efficiency for the additional element and the green element, and a relatively lower efficiency for the red and blue elements. Therefore, an optimized display according to the present invention may have relatively larger red, blue and additional elements, and relatively smaller green elements. For example, in applications for which black and white use dominates, the additional white OLED elements will be used more heavily than any of the gamut defining elements and may therefore be increased in size to reduce the current density and hence aging of the additional element. Text and graphic based applications are typically of this type.

An example of this arrangement described above is shown in FIG. 6, where the green light emitting element 32 is relatively smaller than the additional element 36, and the red and blue elements 30 and 34 are relatively larger than the additional element. The red and blue elements 30 and 34 are largest to compensate for their relatively lower efficiency and the additional element 36 is larger than the green element 32 to accommodate the larger usage of non-saturated colors in a typical application. The relative size of the additional element with respect to the red and blue elements may be adjusted to compensate for their relative efficiencies and expected use.

The invention has been described in detail with particular reference to certain preferred embodiments thereof, but it will be understood that variations and modifications can be effected within the spirit and scope of the invention.

Parts List 10 display device
12 display
14 array
16 pixel
18 sensor
20 brightness control signal
22 circuit
24 white display signal
26 color display signal
28 display controller
29 color image signal
30 red light emitting element
32 green light emitting element
34 blue light emitting element
36 white light emitting element

What is claimed is:

1. A color display, comprising:
   a) an array of light emitting pixels, each pixel having a plurality of color light emitting elements for emitting different colors of light and at least one additional light emitting element for emitting white light and wherein the power efficiency of the additional light emitting element is higher than the power efficiency of at least one of the color light emitting elements;
   b) means for generating a brightness control signal; and
   c) means responsive to the brightness control signal and a color display signal for generating a white display signal for driving the white light emitting element(s).

2. The color display claimed in claim 1, wherein the means for generating the brightness control signal comprises a photosensor located to sense ambient illumination.

3. The color display claimed in claim 1, wherein the means for generating the brightness control signal comprises an operator controlled input device.

4. The display claimed in claim 1, wherein the means for generating the white display signal includes one or more lookup tables.

5. The display claimed in claim 1, wherein the color light emitting elements produce red, green, and blue light.

6. The display claimed in claim 1, wherein the additional white light emitting element is larger than any of the color light emitting elements.

7. The display claimed in claim 1, wherein each pixel comprises three color light emitting elements and one white light emitting element.

8. The display claimed in claim 7, wherein the light emitting elements form a stripe or a two by two matrix pattern.

9. The display claimed in claim 2, wherein the photosensor and the light emitting elements are formed on a common substrate.

10. The display claimed in claim 9, wherein the means for generating the white display signal is also formed on the common substrate.

11. The display claimed in claim 1, wherein the display is a top emitting OLED device.

12. The display in claim 1, wherein the display is a bottom emitting OLED device.

13. The display in claim 1, wherein the display is an active matrix device.

14. The display in claim 1, wherein the display is a passive-matrix device.

15. The display claimed in claim 1, wherein the display device is an LCD display device.

16. The display claimed in claim 1, wherein the light emitting elements have different sizes.

17. The display claimed in claim 1, wherein the light emitting elements have different shapes.

18. The display claimed in claim 1, wherein the white light emitting element has the same white point as a white point of the display.

19. A method of displaying a color image, comprising:
   a) providing an array of light emitting pixels, each pixel having a plurality of color light emitting elements for emitting different colors of light and at least one additional light emitting element for emitting white light and wherein the power efficiency of the additional light emitting element is higher than the power efficiency of at least one of the color light emitting elements;
   b) generating a brightness control signal;
   c) responsive to the brightness control signal and a color display signal, generating a white display signal; and
   d) driving the white light emitting element(s) with the white display signal and driving the color light emitting elements with the color display signal.

20. The method claimed in claim 19, wherein the step of generating the brightness control signal includes using a photosensor to sense ambient illumination.

21. The method claimed in claim 19, wherein the means for generating the brightness control signal comprises an operator controlled input device.

22. The method claimed in claim 19, wherein the step of generating the white display signal includes employing one or more lookup tables.

23. The method claimed in claim 19, wherein the color light emitting elements produce red, green, and blue light.

24. The method claimed in claim 19, wherein the additional white light emitting element is larger than any of the color light emitting elements.

25. The method claimed in claim 19, wherein each pixel comprises three color light emitting elements and one white light emitting element.

26. The method claimed in claim 25, wherein the light emitting elements form a stripe or a two by two matrix pattern.

27. The method claimed in claim 20, wherein the photosensor and the light emitting elements are formed on a common substrate.

28. The method claimed in claim 27, wherein the step of generating the white display signal employs a circuit that is also formed on the common substrate.

29. The method claimed in claim 19, wherein the display is a top emitting OLED device.

30. The method in claim 19, wherein the display is a bottom emitting OLED device.

31. The method in claim 19, wherein the display is an active matrix device.

32. The method in claim 19, wherein the display is a passive matrix device.

33. The method claimed in claim 19, wherein the display device is an LCD display device.

34. The method claimed in claim 19, wherein the light emitting elements have different sizes.

35. The method claimed in claim 19, wherein the light emitting elements have different shapes.

36. The method claimed in claim 19, wherein the white light emitting element has the same white point as a white point of the display.

* * * * *